US006967486B2

(12) United States Patent
Schneider

(10) Patent No.: US 6,967,486 B2
(45) Date of Patent: Nov. 22, 2005

(54) TWO CONDUCTOR MEASURING DEVICE, METHOD FOR TESTING THE SAME AND TESTING SYSTEM THEREFOR

(75) Inventor: Georg Schneider, Schopfheim (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 52 days.

(21) Appl. No.: 10/276,298

(22) PCT Filed: Apr. 18, 2001

(86) PCT No.: PCT/EP01/04386

§ 371 (c)(1), (2), (4) Date: Nov. 22, 2002

(87) PCT Pub. No.: WO01/91082

PCT Pub. Date: Nov. 29, 2001

(65) Prior Publication Data

US 2003/0122537 A1 Jul. 3, 2003

(30) Foreign Application Priority Data

May 22, 2000 (EP) .......................................... 00110818

(51) Int. Cl.[7] ....................... G01R 31/00; G01R 31/14; H01H 31/02

(52) U.S. Cl. ....................... 324/503; 324/500; 324/509; 324/555

(58) Field of Search ................................ 324/503, 500, 324/555, 509, 537, 539

(56) References Cited

U.S. PATENT DOCUMENTS 4,331,912 A 5/1982 Ruesch et al. .............. 323/271
5,748,008 A * 5/1998 Landreth .................... 324/763
6,265,879 B1 * 7/2001 Landreth .................... 324/537
6,559,660 B1 * 5/2003 Staerzl ....................... 324/712

FOREIGN PATENT DOCUMENTS

EP 0895209 A1 2/1999

* cited by examiner

*Primary Examiner*—Anjan Deb
*Assistant Examiner*—John Teresinski
(74) *Attorney, Agent, or Firm*—Bacon & Thomas

(57) ABSTRACT

A two conductor measuring device (MS) is supplied with a current of a current loop, which originates from a source circuit (Q). The source circuit is certified in accordance with a valid standard IEC-1000-4-5, especially in accordance with standard IEC-1000-4-5:1995, is supplied with power by a primary vehicle electrical system (NP), and serves to supply a secondary vehicle electrical system (NS) with power. The two conductor measuring device (MS) is designed in such a way that it cannot be certified for an electromagnetic compatibility in accordance with valid standard IEC-1000-4-5. During testing the two conductor measuring device (MS) for electromagnetic compatibility, a hybrid generator, especially in accordance with standard IEC-60-1 or IEC-469-1, is used for generating a current/voltage surge. A decoupling network for simulating the source circuit (Q) is connected in an outgoing circuit to the hybrid generator. A two conductor measuring device (MS), which does not satisfy the test specifications of the standard IEC-1000-4-5:1995, is connected in the outgoing circuit to the decoupling network, and a type of approval for use on the secondary vehicle electrical system (NS) is granted to other two conductor measuring devices of the same type when the tested two conductor measuring device has withstood the test.

12 Claims, 1 Drawing Sheet

TWO CONDUCTOR MEASURING DEVICE, METHOD FOR TESTING THE SAME AND TESTING SYSTEM THEREFOR

RELATED APPLICATIONS

This application claims the priority of the PCT International Patent Application No. PCT/EP01/o4386, filed Apr. 18, 2001, which is based on EPO Patent Application No. 00110818.2 filed May 22, 2000.

FIELD OF THE INVENTION

The invention relates to two conductor measuring devices, methods for testing such devices, and testing systems designed for use in performing the tests.

BACKGROUND OF THE INVENTION

In the following discussion, reference is made to FIG. 1. As is known, two conductor measuring devices are measuring devices that are equipped with only two conductors L1, L2, which enable them to be electrically connected from and to the outside. These two conductors must be used both for supplying energy and for transmitting a measuring signal generated by the measuring device. The measuring signal values produced by the two conductor measuring device are direct currents within a standardized range of 4 mA to 20 mA, such that one current value within this range corresponds precisely to one measuring signal value.

The above-mentioned supplying of energy is accomplished by means of a direct current source that, during operation, is connected to the two conductors from the outside, generates a direct current, and belongs to a primary network NP, so that a so-called current loop is created. This loop also contains a current measuring resistor Rm, where a current that is proportional to the current value at any given time, and thus to the measuring signal, can be tapped and further processed.

The resistor Rm can be positioned a great distance from the two conductor measuring device MS, in this case it is connected to the measuring device via cables of appropriate length. Specifically, the terminal NP1 of the primary network NP is connected to the conductor L1 of the two conductor measuring device MS', and the terminal NP2 is connected to one port of the resistor Rm, while the resistor's other port is connected to the conductor L2 as an indirect second primary network port NP2', as it were.

In addition to the above-mentioned current values, which are analog signals, digital signals can also be transmitted at the two conductors L1, L2, in accordance with one of the customary standards, such as the so-called HART protocol. The HART protocol (HART is a registered trademark of the HART User Group and is an acronym for "Highway Addressable Remote Transducer", in other words for bus-addressed measuring devices) has long been known and used in industrial measuring technology.

The HART protocol enables communication between a field level and a process control level, providing the advantage of simultaneous transmissibility of an analog measuring signal in accordance with the 4-mA to 20 mA standard, and of the digital HART signal for start-up, maintenance, polling, or control of the measuring devices in the field level.

While the analog measuring signal is continuously available, cyclical polling and, if necessary, a subsequent instruction via the digital HART signals takes place. In this process, a digital zero is realized via two sine-wave oscillations at a frequency of 2.2 kHz, and a digital one is realized via a single sine-wave oscillation at a frequency of 1.2 kHz, in keeping with the standard Bell 202 Frequency Shift Keying. These sine-wave oscillations are transmitted via the two conductors, in that they are modulated upon the current flowing therein.

Current state-of-the-art two conductor measuring devices are competitive, in other words marketable by the manufacturer, only if they have been tested for electromagnetic compatibility (abbreviated: EMV). The testing must be conducted in compliance with the currently valid international standard IEC-1000-4-5:1995, which has been adopted in individual countries to correspond with national standards, and is a so-called type test.

In a type test, each individually produced device is not tested. Instead, the testing of one or a few devices from a group of identical devices is sufficient.

The standard IEC-1000-4-5:1995 has been valid since 1995. According to the previous version, which was valid until 1995, the two conductors L1, L2 were considered only as signal lines used to transmit measuring signals, and thus were not subject to the more rigorous specifications for energy supply lines, for which the conductors were tested.

In 1995, however, this approach and classification was tightened, with the direct connection of the two conductor measuring devices to the direct current source G and/or its primary electrical system NP; the two conductors L1, L2 now are no longer defined merely as signal lines, but also as supply lines, hence they are subject to the above-named rigid test specifications and are tested on that basis.

These test specifications require that the primary electrical system that serves to supply energy and originates from the direct current source Q also generate high-energy interference pulses in addition to the direct current, which a two conductor measuring device MS' that is connected to the network must withstand.

These test specifications simulate real conditions such as occur in practice when two conductor measuring devices e.g. are to be used for means of transport, especially in ships. In a primary vehicle electrical system NP installed on a ship, the above-mentioned interference pulses are frequently present, (FIG. 1). Hence, the two conductors L1, L2, in state-of-the-art two conductor measuring devices must be tested using the test signals based upon the standard IEC-1000-4-5:1995 for energy supply lines, hence they are to be dimensioned to be resistant relative to these test signals.

This does not make sense in practical terms, however, since it would mean that in the two conductor measuring device MS', which is equipped with a standardized case Gh, electronic components, i.e. a conductance coil L' and a condenser C', would have to be incorporated at the input side in a suitable combination, serving to suppress or at least filter the interference pulses that occur in the primary vehicle electrical system NP.

These incorporated elements, however, increase production costs. Furthermore, the dynamic space SF required for these filter components, which in most cases must be installed in multiples, is not available, so that the size of the standardized casing Gh must be increased by a casing volume Gz, which increases costs substantially. Finally, the applicability of the above-mentioned HART protocol is severely curtailed as a result of the filter components, and in some cases is rendered impossible.

SUMMARY OF THE INVENTION

One object of the invention is to provide a two conductor measuring device intended for use in means of transport, especially in a ship A further object of the invention is to provide a method for testing the electromagnetic compatibility of a two conductor measuring device that is intended for use in a means of transport, especially in a ship, in accordance with the standard IEC-1000-4-5:1995.

Another object of the invention is to provide a test system for testing the electromagnetic compatibility of a two conductor measuring device that is intended for use in a means of transport, especially in a ship. Finally, an object of the invention consists in providing a method for granting approval for use of a two conductor measuring device that is intended for use in a means of transport, especially in a ship.

To attain these objects, a first variant of the invention consists of a two conductor measuring device

- that is intended for use in a means of transport, especially in a ship,
- wherein it is supplied on-board with current from a current loop,
- which originates from a source circuit that is certified in accordance with a valid standard IEC-1000-4-5, especially the standard IEC-1000-4-5:1995, is supplied with power by a primary vehicle electrical system of the means of transport, and serves to supply a secondary vehicle electrical system with power, and
- wherein the two conductor measuring device is designed such that it cannot be certified for electromagnetic compatibility in accordance with the valid standard IEC-1000-4-5.

To attain the above-mentioned objects, a second variant of the invention comprises a method for testing the electromagnetic compatibility of a two conductor measuring device that is intended for use in a means of transport, especially a ship, where it is supplied on-board with current from a current loop, which originates from a source circuit that is certified in accordance with a valid standard IEC-1000-4-5, especially the standard IEC-1000-4-5:1995, is supplied with power by a primary vehicle electrical system of the means of transport, and serves to supply a secondary vehicle electrical system with power, in which method

- a hybrid generator, especially one that is in accordance with the standard IEC-60-1 or IEC 469-1, is used to generate a current/voltage surge,
- a decoupling network for simulating 5 the source circuit is connected in outgoing circuit to the hybrid generator,
- a two conductor measuring device, which does not satisfy the test specifications of the standard IEC-1000-4-5:1995, is connected in outgoing circuit to said decoupling network, and
- an 10 approval for use in the secondary vehicle electrical system is granted to other two conductor measuring devices of the same type when the tested two conductor measuring device has withstood the test.

To attain the above-named objects, a third variant of the invention comprises a test system for testing the electromagnetic compatibility of a two conductor measuring device that is intended for use in a means of transport, especially a ship, where it is supplied on-board with current from a current loop, which originates from a source circuit that is certified in accordance with a valid standard IEC-1000-4-5, especially the standard IEC-1000-4-5:1995, is supplied with power by a primary vehicle electrical system of the means of transport, and serves to supply a secondary vehicle electrical system with power; wherein this test system comprises:

- a hybrid generator, especially one in accordance with the standard IEC-60-1 or IEC 469-1, for generating a current/voltage surge,
- a decoupling network for simulating the source circuit, connected in outgoing circuit to the hybrid generator, and
- a two conductor measuring device that does not satisfy the test specifications of the standard IEC-1000-4-5, and is connected in outgoing circuit to said decoupling network.

To attain the above-mentioned objects, a fourth variant of the invention consists in a method for granting an approval for use of a two conductor measuring device that is intended for use in a means of transport, especially in a ship, where it is supplied on-board with current from a current loop, which originates from a source circuit that is certified in accordance with a valid standard IEC-1000-4-5, especially the standard IEC-1000-4-5:1995, is supplied with power by a primary vehicle electrical system of the means of transport, and serves to supply a secondary vehicle electrical system with power, in which method the approval for use of the two conductor measuring device is granted only if it is to be used exclusively in the certified source circuit of the means of transport, without being certified in accordance with the test specifications of the current valid standard IEC-1000-4-5.

One significant advantage of the invention consists in the fact that, in two conductor measuring devices that are to be used in means of transport, especially in ships, no costly components that require dynamic space and suppress and/or filter interference pulses are necessary, and in that an approval for use according to the standard IEC 1000-4-5:1995 can nevertheless be granted for such two conductor measuring devices.

The invention will be described below in greater detail, with reference to the second figure in the diagrams, FIG. 2, in which an exemplary embodiment of a two conductor measuring device is illustrated schematically in the form of a block diagram.

DESCRIPTION OF THE PREFERRED EMBODIMENT

Figure 1:
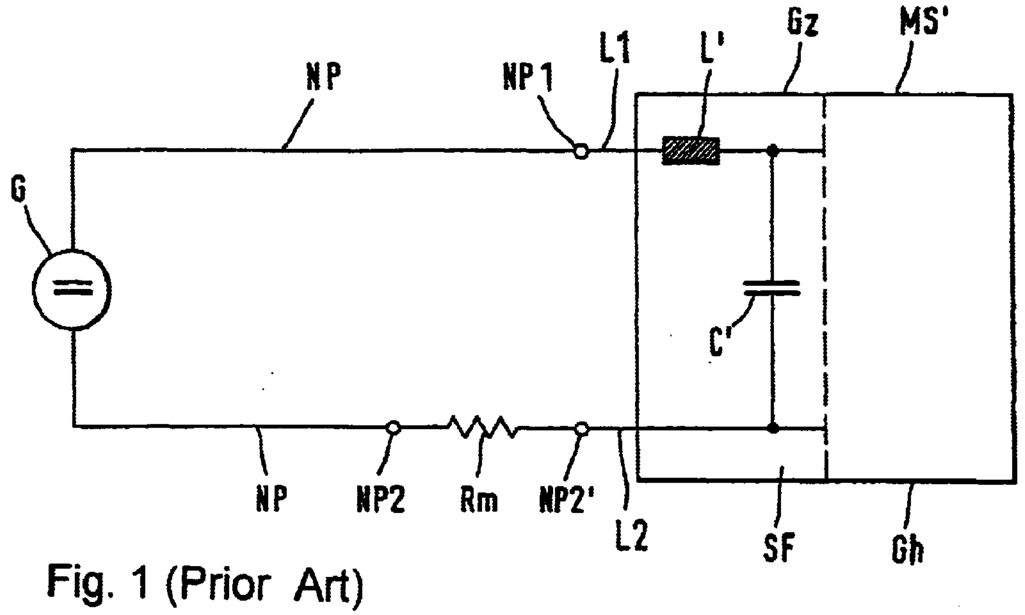
Fig. 1 (Prior Art)
FIG. 1 illustrates a known two conductor measuring device (MS) with outside connections.
Figure 2:
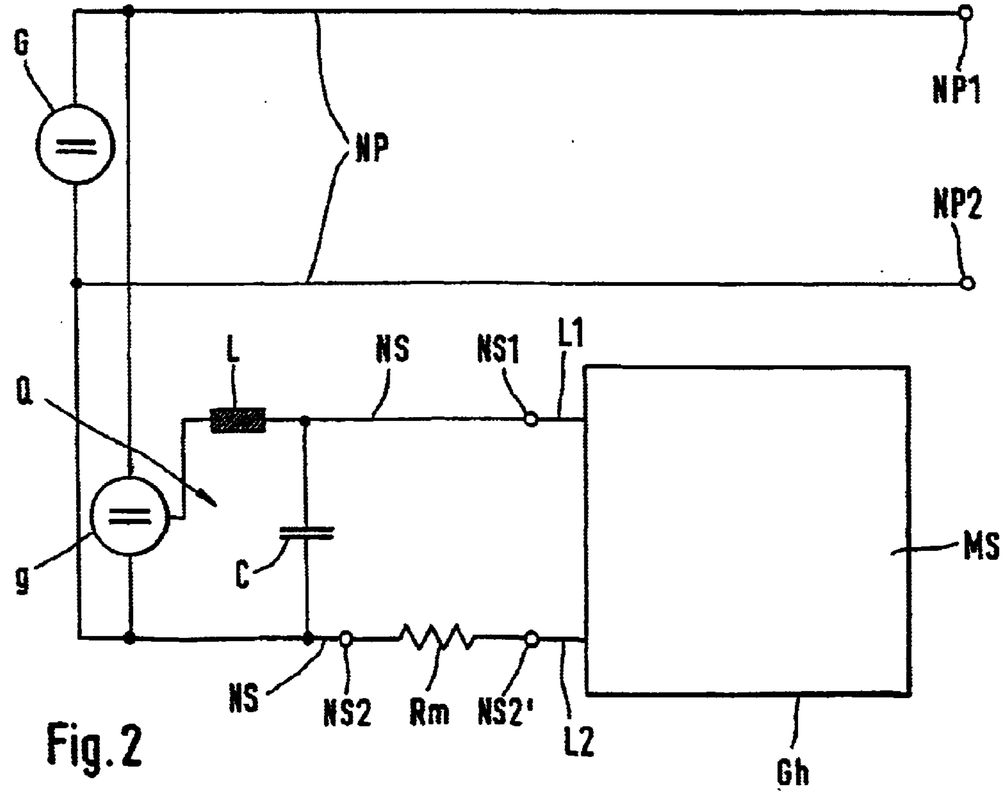
FIG. 2 illustrates a two conductor measuring device (MS) with outside connections according to the present invention.
Figure 1:
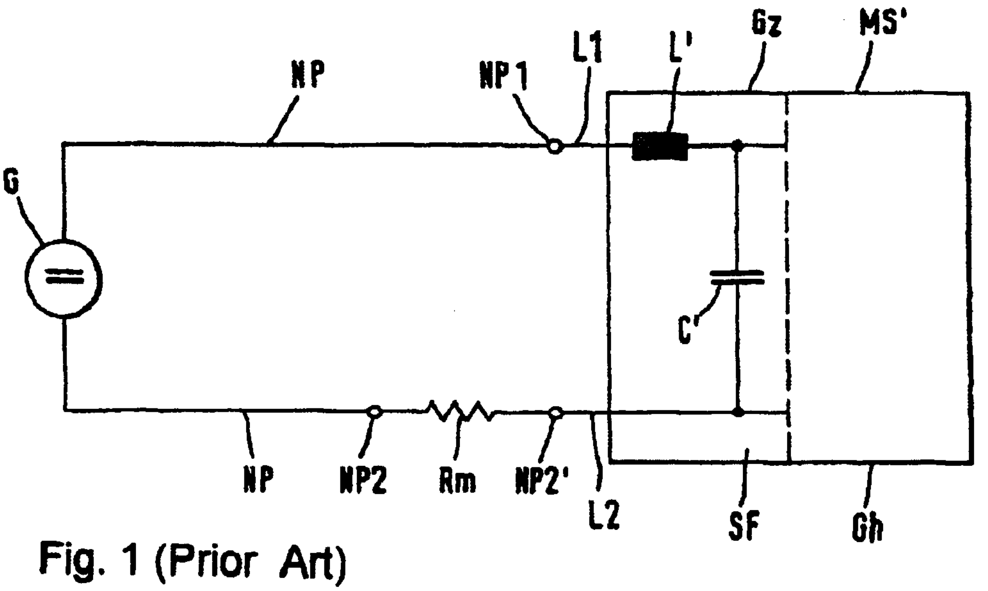
Fig. 1 (Prior Art)
Figure 2:
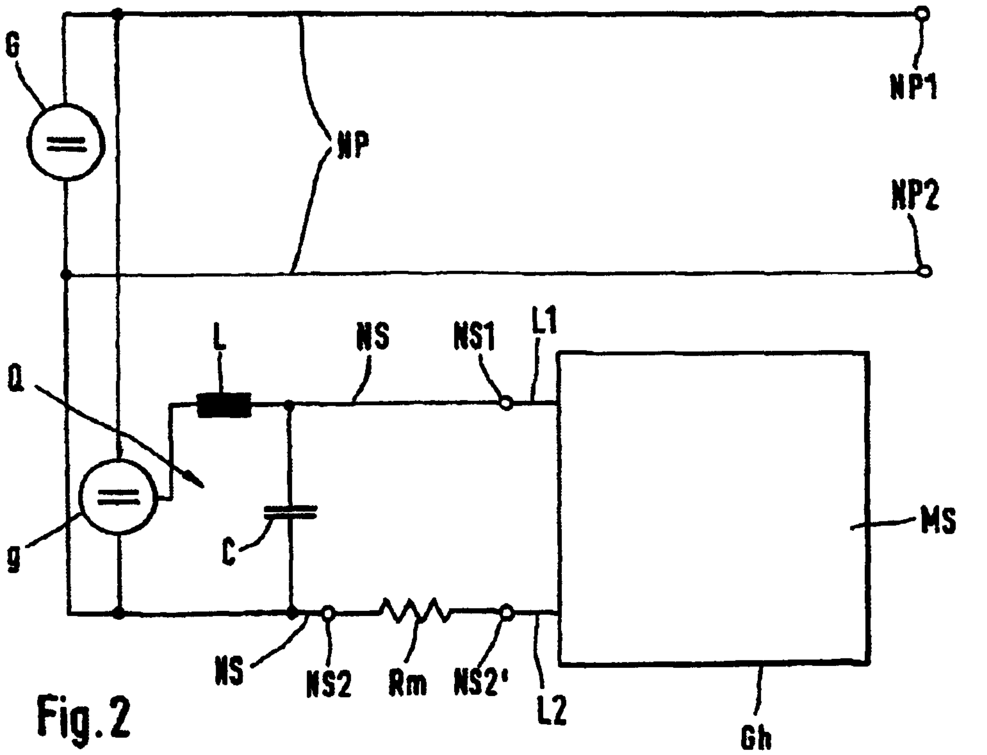

In FIG. 2, a traditional two conductor measuring device MS, e.g. with a standard casing Gh, is depicted as a circuit block. At least one physical dimension is measured by the two conductor measuring device MS, i.e. the volumetric or mass flow of a fluid, or its density, viscosity, pressure, or temperature, or even the difference in pressure between two media, or very generally the temperature, pressure, level, pH value, or gas concentration.

Because the invention relates not to the measuring principle of the two conductor measuring device MS and its electronic circuitry, specifically its evaluation electronics, but rather relates to its certification independent of the measuring principle, its circuit block is not illustrated or described in any greater detail.

The two conductor measuring device MS is intended for use in a means of transport, especially a ship. There it is supplied on-board with current from a current loop, which originates from a source circuit Q that is certified in accordance with a valid standard IEC-1000-4-5, especially the standard IEC-1000-4-5:1995, is supplied with power by a primary vehicle electrical system NP of the means of transport, and serves to supply a secondary vehicle electrical system NS with power.

The two terminals NP1, NP2 thus lie at supply terminals for the source circuit Q, one active part of which is presented, for the sake of simplicity, as the source g of a direct current, with filter components, such as an inductance coil and a condenser C, being presented as components of this active part, so that a secondary vehicle electrical system NS with the terminals NS1, NS2' is created at its output. In this case as well, the current measuring resistor Rm is connected between the terminal NS2 and the conductor L2, hence the terminal of the resistor Rm that faces the measuring device can be referred to as an indirect terminal of the secondary vehicle electrical system NS2'.

The filter components are dimensioned, conceived, and designed such that the secondary vehicle electrical system NS complies with a valid standard IEC-1000-4-5, especially the standard IEC-1000-4-5:1995, and thus can be tested and certified in accordance with this standard.

On the basis of this inventive design, the two conductor measuring device MS surprisingly needs only to be designed such that it cannot be EMV certified for electromagnetic compatibility in accordance with the valid standard IEC-1000-4-5.

Hence, an approval for use of a two conductor measuring device MS intended for use in a means of transport, especially in a ship, can be granted as follows, i.e. it can be EMV certified as follows: When in use in the means of transport, the two conductor measuring device MS is supplied on-board with current from a current loop, wherein the current originates from a source circuit Q that is certified in accordance with a valid standard IEC-1000-4-5, especially the standard IEC-1000-4-5:1995, is supplied with power by a primary vehicle electrical system NP of the means of transport, and serves to supply a secondary vehicle electrical system NS with power. The source circuit is in compliance with the test specifications of the valid standard IEC-1000-4-5 and will be or is already EMV certified, in other words it possesses this approval for use and/or the corresponding certificate.

Thus the approval for use of the two conductor measuring device, in other words its EMV certificate, is granted in accordance with the valid standard IEC-1000-4-5 only if, without being EMV certified in accordance with the test specifications of the valid standard IEC-1000-4-5:1995, it will be used exclusively in the EMV-certified secondary vehicle electrical system of the means of transport. In order to fulfill this condition, the two conductor measuring device MS may be equipped e.g. with a correspondingly dimensioned terminal connecting device.

Figure 3:
FIG. 3 illustrates a hybrid generator, the decoupling network and the measuring device in block diagram form.

The method specified in the invention for testing the electromagnetic compatibility of the two conductor measuring device MS that is intended for use in a means of transport, especially in a ship, is implemented as follows (the measuring device MS in this case is also supplied with the above-described current from the current loop that contains the source circuit Q):

A hybrid generator (10), especially in accordance with the standard IEC-60-1 or 10 IEC 469-1, generates a current/voltage surge, especially the current/voltage surge defined in this standard in reference to the temporal course of the open-circuit voltage and the temporal course of the short-circuit current. A decoupling network (12), also defined by the above-mentioned standard, for simulating the source circuit Q is connected in outgoing circuit to the hybrid generator, and a two conductor measuring device MS (14), which does not satisfy the test specifications of the standard IEC-1000-4-5:1995 is connected in outgoing circuit to said decoupling network (FIG. 3).

The approval for use in the secondary vehicle electrical system NS of the means of transport is granted to other two conductor measuring devices, hence the EMV certification is granted them, when the tested two conductor measuring device MS has withstood the test.

A test system, specified in the invention, for testing the electromagnetic compatibility of a two conductor measuring device that is intended for use in a means of transport, especially in a ship, comprises the above-mentioned hybrid generator, especially in accordance with the standard IEC-60-1 or IEC 469-1, for generating the above-described current/voltage surge, the decoupling network connected in outgoing circuit to the hybrid generator and intended for simulating the secondary vehicle electrical system NS, and the two conductor measuring device that is connected in outgoing circuit to the decoupling network and is not certified in accordance with the test specifications of the valid standard IEC-1000-4-5.

What is claimed is:

1. A two conductor measuring device (MS) for use in transport, especially in a ship, comprising:

a source circuit (Q), certified in accordance with a valid standard, IEC 1000-4-5;

a primary vehicle electrical system (NP); and a secondary vehicle electrical system (NS), wherein:

said source circuit (Q) is supplied with primary power by said primary vehicle electrical system (NP);

said source circuit (Q) serving to supply power to said secondary vehicle electrical system (NS);

the two conductor measuring device (MS) is supplied on-board the ship transport with current from a current loop, the current originating from said source circuit (Q) and the two conductor measuring device generates a measuring signal value and transmits the measuring signal value via said current loop; and the two conductor measuring device (MS) is designed such that it cannot be certified for electromagnetic compatibility in accordance with the valid standard, IEC-1000-4-5.

2. The two conductor measuring device (MS) as defined in claim 1, wherein the valid standard is IEC-1000-4-5:1995.

3. The two conductor measuring device as claimed in claim 1, wherein the two conductor measuring device measures at least one physical dimension being selected from a group consisting of a volumetric flow of a fluid, a mass flow of a fluid, a density of a fluid, a viscosity of a fluid, a pressure of a fluid, a temperature of a medium, difference in pressure between two media, a level, a pH value and a gas concentration.

4. A method for testing the electromagnetic compatibility of a two conductor measuring device (MS) for use in transport, especially in a ship, the two conductor measuring device (MS) being supplied on board the transport with current from a current loop, which originates from a source circuit that is certified in accordance with a valid standard IEC-1000-4-5, with power by a primary vehicle electrical system (NP) of the transport, and serves to supply a secondary vehicle electrical system (NS) with power, and the two conductor measuring device generates a measuring signal value and transmits the measuring signal value via said current loop, said method comprising the steps of:

generating a current/voltage surge with a hybrid generator, especially in accordance with one of: the standard IEC-60-1, and IEC 469-1;

connecting a decoupling network in outgoing circuit to the hybrid generator for simulating the source circuit (Q);

connecting in outgoing circuit to the decoupling network of a two conductor measuring device which does not satisfy the test specifications of the standard IEC-1000-4-5; and granting approval for use in the secondary vehicle electrical system (NS) other two conductor measuring devices of the same type when the tested two conductor measuring device has withstood the test.

5. The method as defined in claim 4, wherein the valid standard is IEC-1000-4-5:1995.

6. The method as claimed in claim 4, wherein the two conductor measuring device to be tested serves to measure at least one physical dimension being selected from a group consisting of a volumetric flow of a fluid, a mass flow of a fluid, a density of a fluid, a viscosity of a fluid, a pressure of a fluid, a temperature of a medium, difference in pressure between two media, a level, a pH value and a gas concentration.

7. A system for testing the electromagnetic compatibility of a two conductor measuring device (MS) for use in transport, especially in a ship, the two conductor measuring device (MS) being supplied on board the transport with current from a current loop, which originates from a source circuit (Q) that is certified in accordance with a valid standard, IEC-1000-4-5, with power by a primary vehicle electrical system (NP) of the transport, and serves to supply a secondary vehicle electrical system (NS) with power, and the two conductor measuring device generates a measuring signal value and transmits the measuring signal value via said current loop, said method comprising:

a hybrid generator, especially in accordance with one of: the standard IEC-60-1, and IEC-469-1, for generating a current/voltage surge;

a decoupling network connected in outgoing circuit to said hybrid generator for simulating the source circuit (Q); and a two conductor measuring device (MS) connected in outgoing circuit to said decoupling network, said two conductor measuring device (MS) being not certified in accordance with the test specifications of the valid standard, IEC-1000-4-5.

8. The system as defined in claim 7, wherein the valid standard is IEC-1000-4-5:1995.

9. The method as claimed in claim 7, wherein the two conductor measuring device to be tested serves to measure at least one physical dimension being selected from a group consisting of a volumetric flow of a fluid, a mass flow of a fluid, a density of a fluid, a viscosity of a fluid, a pressure of a fluid, a temperature of a medium, difference in pressure between two media, a level, a pH value and a gas concentration.

10. A method for granting approval for a two conductor measuring device (MS) for use in transport, especially in a ship, the two conductor measuring device (MS) being supplied on board with current from a current loop, which originates from a source circuit (Q) that is certified in accordance with a valid standard, IEC-1000-4-5, with power by a primary vehicle electrical system (NP) of the transport, and serves to supply a secondary vehicle electrical system with power, and the two conductor measuring device transmits a measuring signal value via said current loop, said measuring signal value is generated by the two conductor measuring device, said method comprising the step of:

granting approval for the use of the two conductor measuring device (MS) only when it is used exclusively in the certified secondary vehicle electrical system (NS) of the transport, without being certified in accordance with the test specifications of the valid standard, IEC-1000-4-5.

11. The method as defined in claim 10, wherein the valid standard is IEC-1000-4-5:1995.

12. The method as claimed in claim 10, wherein the two conductor measuring device to be approved serves to measure at least one physical dimension being selected from a group consisting of a volumetric flow of a fluid, a mass flow of a fluid, a density of a fluid, a viscosity of a fluid, a pressure of a fluid, a temperature of a medium, difference in pressure between two media, a level, a pH value and a gas concentration.

* * * * *

UNITED STATES PATENT AND TRADEMARK OFFICE
CERTIFICATE OF CORRECTION

PATENT NO. : 6,967,486 B2
APPLICATION NO. : 10/276298
DATED : November 22, 2005
INVENTOR(S) : Schneider It is certified that error appears in the above-identified patent and that said Letters Patent is hereby corrected as shown below:

Please add Fig. 3 as shown below

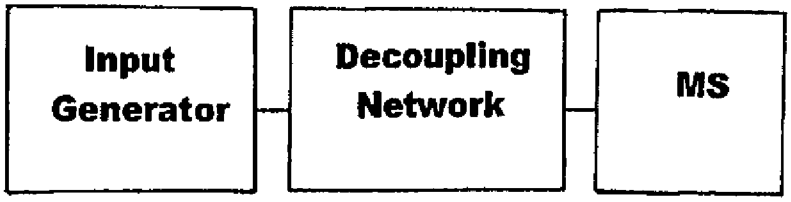

Fig. 3

Signed and Sealed this

Second Day of February, 2010

David J. Kappos
*Director of the United States Patent and Trademark Office*

UNITED STATES PATENT AND TRADEMARK OFFICE

CERTIFICATE OF CORRECTION

PATENT NO. : 6,967,486 B2
APPLICATION NO. : 10/276298
DATED : November 22, 2005
INVENTOR(S) : Georg Schneider It is certified that error appears in the above-identified patent and that said Letters Patent is hereby corrected as shown below:

Delete the title page and substitute therefore the attached title page showing the corrected number of drawing sheets in printed patent.

Delete the Drawing Sheet and substitute therefore the attached Drawing Sheets 1 and 2 adding FIG. 3.

This certificate supersedes the Certificate of Correction issued February 2, 2010.

Signed and Sealed this

Twenty-third Day of February, 2010

David J. Kappos

David J. Kappos
*Director of the United States Patent and Trademark Office*

(12) United States Patent
Schneider

(10) Patent No.: US 6,967,486 B2
(45) Date of Patent: Nov. 22, 2005

(54) TWO CONDUCTOR MEASURING DEVICE, METHOD FOR TESTING THE SAME AND TESTING SYSTEM THEREFOR

(75) Inventor: Georg Schneider, Schopfheim (DE)

(73) Assignee: Endress + Hauser GmbH + Co. KG, Maulburg (DE)

(*) Notice: Subject to any disclaimer, the term of this patent is extended or adjusted under 35 U.S.C. 154(b) by 52 days.

(21) Appl. No.: 10/276,298

(22) PCT Filed: Apr. 18, 2001

(86) PCT No.: PCT/EP01/04386

§ 371 (c)(1),
(2), (4) Date: Nov. 22, 2002

(87) PCT Pub. No.: WO01/91082

PCT Pub. Date: Nov. 29, 2001

(65) Prior Publication Data

US 2003/0122537 A1 Jul. 3, 2003

(30) Foreign Application Priority Data

May 22, 2000 (EP) ........................................ 00110818

(51) Int. Cl.[7] ........................ G01R 31/00; G01R 31/14; H01H 31/02

(52) U.S. Cl. ........................ 324/503; 324/500; 324/509; 324/555

(58) Field of Search ........................ 324/503, 500, 324/555, 509, 537, 539

(56) References Cited

U.S. PATENT DOCUMENTS 4,331,912 A 5/1982 Ruesch et al. .............. 323/271
5,748,008 A * 5/1998 Landreth .................... 324/763
6,265,879 B1 * 7/2001 Landreth .................... 324/537
6,559,660 B1 * 5/2003 Staerzl ...................... 324/712

FOREIGN PATENT DOCUMENTS

EP 0895209 A1 2/1999

* cited by examiner

*Primary Examiner*—Anjan Deb
*Assistant Examiner*—John Teresinski
(74) *Attorney, Agent, or Firm*—Bacon & Thomas

(57) ABSTRACT

A two conductor measuring device (MS) is supplied with a current of a current loop, which originates from a source circuit (Q). The source circuit is certified in accordance with a valid standard IEC-1000-4-5, especially in accordance with standard IEC-1000-4-5:1995, is supplied with power by a primary vehicle electrical system (NP), and serves to supply a secondary vehicle electrical system (NS) with power. The two conductor measuring device (MS) is designed in such a way that it cannot be certified for an electromagnetic compatibility in accordance with valid standard IEC-1000-4-5. During testing the two conductor measuring device (MS) for electromagnetic compatibility, a hybrid generator, especially in accordance with standard IEC-60-1 or IEC-469-1, is used for generating a current/voltage surge. A decoupling network for simulating the source circuit (Q) is connected in an outgoing circuit to the hybrid generator. A two conductor measuring device (MS), which does not satisfy the test specifications of the standard IEC-1000-4-5:1995, is connected in the outgoing circuit to the decoupling network, and a type of approval for use on the secondary vehicle electrical system (NS) is granted to other two conductor measuring devices of the same type when the tested two conductor measuring device has withstood the test.

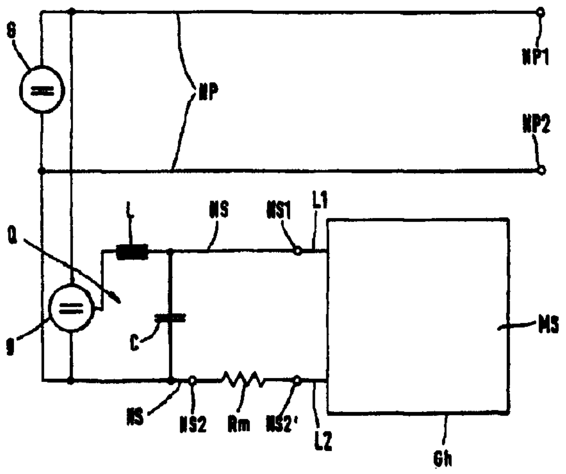

12 Claims, 2 Drawing Sheets